United States Patent
Elofsson et al.

[11] Patent Number: 5,881,373
[45] Date of Patent: Mar. 9, 1999

[54] MUTING A MICROPHONE IN RADIOCOMMUNICATION SYSTEMS

[75] Inventors: Richard K. Elofsson, Stehag; Hans Fredrik Svensson, Staffanstorp, both of Sweden

[73] Assignee: Telefonaktiebolaget LM Ericsson, Stockholm, Sweden

[21] Appl. No.: 697,569

[22] Filed: Aug. 28, 1996

[51] Int. Cl.[6] ............................. H03C 1/62; H04B 17/00
[52] U.S. Cl. ................................ 455/115; 455/67.1
[58] Field of Search ..................... 455/563, 115, 455/116, 517, 67.1, 501, 63, 67.3, 222, 296, 225, 221, 212, 218, 79; 370/528, 349, 527, 435, 433, 434, 465; 375/346, 351, 278, 284, 285, 228; 704/227

[56] References Cited

U.S. PATENT DOCUMENTS

| | | | |
|---|---|---|---|
| 4,864,561 | 9/1989 | Ashenfelter et al. | 370/435 |
| 5,121,385 | 6/1992 | Tominaga et al. | 370/435 |
| 5,220,565 | 6/1993 | Wilson et al. | 370/349 |
| 5,220,685 | 6/1993 | Bradt et al. | 455/218 |
| 5,475,712 | 12/1995 | Sasaki | 375/241 |
| 5,511,237 | 4/1996 | Sakaguchi | 455/79 |
| 5,537,509 | 7/1996 | Swaminathan et al. | 704/214 |
| 5,692,017 | 11/1997 | Shiokawa | 375/346 |
| 5,737,695 | 4/1998 | Lagerqvist et al. | 455/79 |

FOREIGN PATENT DOCUMENTS

| | | |
|---|---|---|
| 658878 | 6/1995 | European Pat. Off. |
| 2256997 | 12/1992 | United Kingdom |
| WO96/22651 | 7/1996 | WIPO |

*Primary Examiner*—Reinhard J. Eisenzopf
*Assistant Examiner*—Marsha D. Banks-Harold
*Attorney, Agent, or Firm*—Burns, Doane, Swecker & Mathis, L.L.P.

[57] ABSTRACT

Comfort noise functions monitor background noise picked up by microphones in radiocommunication systems. These functions provide comfort noise information which is transmitted by remote units during periods of silence, so that the receiving party's equipment can output the proper background noise while the transmitting side can deactivate the transmitting circuitry to conserve power. Muting functions are accommodated by continuing to provide signals to the comfort noise functions so that the background noise is continuously monitored. When the muting mode of a remote unit is enabled, the transmitter receives comfort noise frames or silence frames instead of information output from a voice (speech) encoder.

18 Claims, 5 Drawing Sheets

MUTING A MICROPHONE IN RADIOCOMMUNICATION SYSTEMS

BACKGROUND

The present invention is generally directed to radiocommunication systems and, more particularly, to techniques and apparatus for muting a microphone used in radiocommunication systems.

The cellular telephone industry has made phenomenal strides in commercial operations both in the United States and the rest of the world. Growth in major metropolitan areas has far exceeded expectations and is rapidly outstripping system capacity. If this trend continues, the effects of this industry's growth will soon reach even the smallest markets. Innovative solutions are required to meet these increasing capacity needs as well as to maintain high quality service and avoid rising prices.

In addition to the challenges posed by a need for greater system capacity, the designers of the remote units used in radio communication systems, e.g., mobile phones, have their own unique set of challenges. For example, a well known challenge in the industry is to extend the time between recharging batteries used to power these remote units, while at the same time continuing to provide additional functionality to satisfy subscriber demand. These competing desires lead remote unit designers to search for creative ways in which to further reduce energy consumption in remote units.

As the radiocommunication industry matures, various subscriber usage patterns have been recognized, For example, it has been found that during a typical voice connection between two subscribers, the actual voice activity transmitted over the air interface accounts for only about 35% of the total connection time. Accordingly, remote units have been designed to take advantage of this fact by actuating the transmission circuitry only during the voice-active portion of a call and rendering the transmission circuitry inoperative during periods of silence. This has been implemented, for example, using a detector for detecting voice activity and a discontinuous transmitter which becomes inoperative when the voice activity detector detects a pause in the user's speech, While this technique has been shown to reduce the power consumption of remote units by turning off the transmitting circuitry for extended periods of time, it poses a problem for reproduction of the voice signal at the receiving side. Specifically, since the transmitter is turned off during periods of silence, the background noise which would otherwise be transmitted over the air interface is not received by the other subscriber's equipment. This, in turn, results in a reproduced voice which is discontinuous and includes audible artifacts, e.g., popping sounds.

One way to overcome this difficulty is to generate artificial background noise for reproduction at the receiving side when no voice signal is transmitted. This artificial background noise is commonly referred to in the art as "comfort noise". Comfort noise can be generated by adaptive functions which monitoring the background noise picked by the microphone of a remote unit. When a pause in speech is detected, the comfort noise functions generate comfort noise information which is transmitted over the air interface instead of speech codes. This information takes relatively little time to transmit, thereby allowing the transmitter to be turned off during most of each period of silence, At the receiving end (or at the base station), the comfort noise information is used to generate background noise so that the listener is not troubled by the discontinuity in transmission.

The comfort noise functions resident in the transmission circuitry of the remote stations are, as described above, adaptive in nature so that they gradually adjust the comfort noise information to reflect changes in the background noise. Thus, the comfort noise functions need to continuously receive information from the microphone in order to accurately determine the background noise to be replicated at the receiving side.

Another function which subscribers desire in remote terminals is the capability to selectively mute transmissions, e.g., by pressing a mute button. Conventionally, this function has been provided by interrupting the signals transmitted from: the microphone to the rest of the transmitting circuitry. This muting solution is problematic, however, from the point of view of the comfort noise functions, since these functions then receive only complete silence from the microphone. This leads to background noise being generated at the receiver which has a lower level than expected by the listener.

Thus, it would be desirable to provide for a muting function which allows a user to selectively mute transmissions from a remote unit, but which does not affect the ability of the system to accurately gauge and reproduce background noise during periods of silence in a conversation.

SUMMARY

These and other drawbacks and limitations of conventional radiocommunication systems are overcome according to exemplary embodiments of the present invention. According to one exemplary embodiment of the present invention, a muting function selectively actuated by a user of a remote terminal is operable to control whether an output of a voice encoder is supplied to a transmitting unit or the output of a silence frame generator is supplied to the transmitting unit. In this way, a user can mute transmissions, but without adversely affecting the information gathering feature of the comfort noise functions during muting. Instead, the silence frame generator generates alternative information for transmission while the subscriber wishes to mute, his or her remote unit. At the same time, the comfort noise functions continue to monitor the background noise picked up by the microphone even though the voice signals are not being transmitted.

According to another exemplary embodiment of the present invention, a comfort noise frame generator generates comfort noise frames for transmission during periods when a user wishes to mute his or her remote unit. In a manner similar to the aforedescribed first exemplary embodiment, this exemplary embodiment provides for switching between the comfort noise generator and the voice encoder, whereby the comfort noise generator continues to receive information during the muting period so that correct comfort noise information is generated during silent periods when the remote station is not being muted.

BRIEF DESCRIPTION OF THE DRAWINGS

The foregoing, and other, objects, features and advantages of the present invention will be more readily understood upon reading the following detailed description in conjunction with the drawings in which.

DETAILED DESCRIPTION

In the following description, for purposes of explanation and not limitation, specific details are set forth, such as particular circuits, circuit components, techniques, etc. in order to provide a thorough understanding of the present invention. However, it will be apparent to those skilled in the art that the present invention may be practiced in other embodiments that depart from these specific details. In other instances, detailed descriptions of well-known methods, devices and circuits are emitted so as not to obscure the description of the present invention with unnecessary detail.

Figure 1:
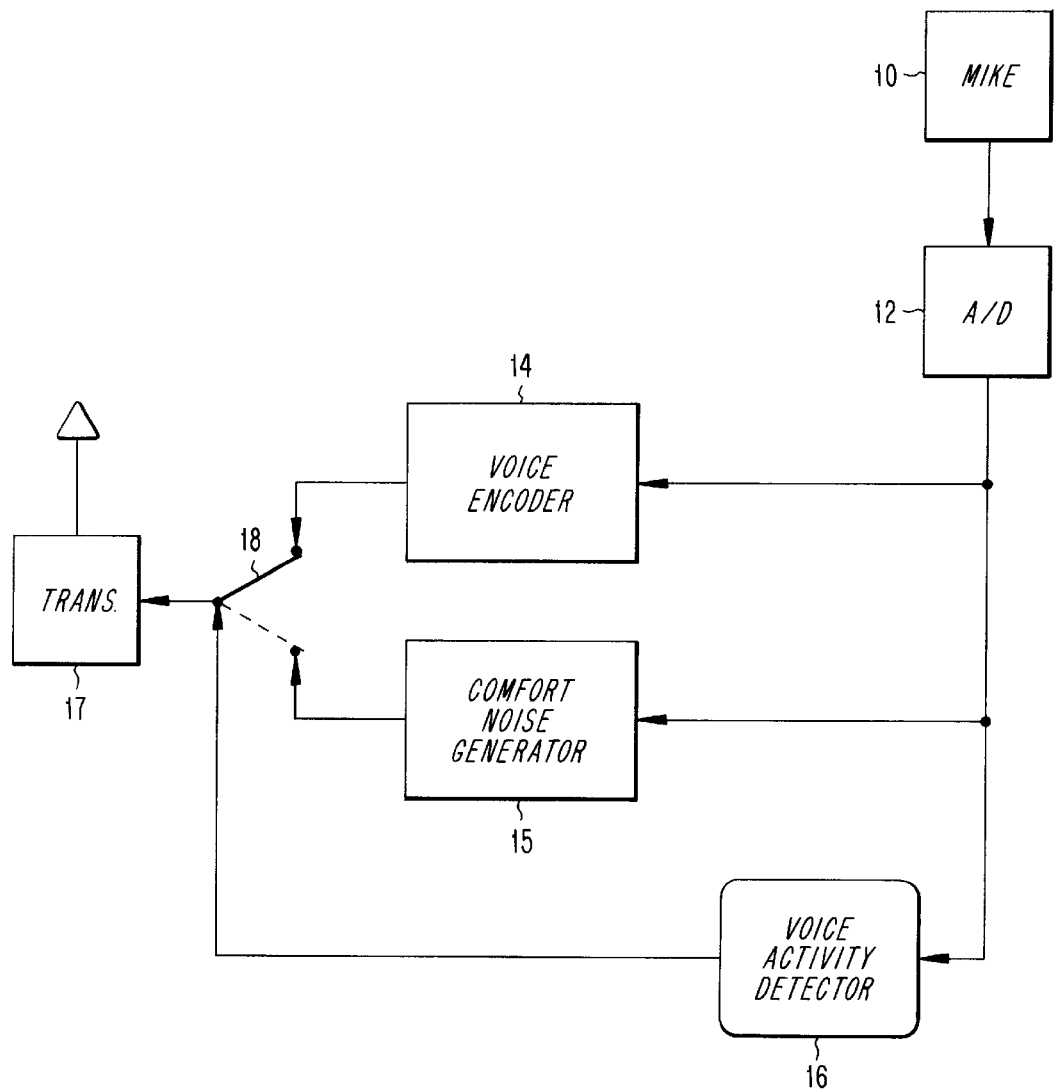
FIG. 1 is a block diagram of a conventional transmission system which can be employed in remote units.

Consider, for example, the block diagram conceptualization of a conventional remote unit transmission circuitry illustrated in FIG. 1. Therein, a microphone 10 picks up the voice sounds of a subscriber as well as any background noise associated with the subscriber's environs. The analog signals picked up by microphone 10 are then converted into digital form by the analog-to-digital (A/D) converter 12. The digitized signal is provided to a voice encoder 14, comfort noise generator 15 and a voice activity detector 16. The voice encoder 14 receives digitized voice signals from A/D converter 12 and synthesizes speech signals to provide an output sequence of synthesized speech codes using, for example, a technique referred to as codebook excited linear prediction (CELP). Those skilled in the art will be aware that other types of speech coding techniques exist, any of which may be used in conjunction with the present invention. The output synthesized speech codes are then forwarded to transmitter unit 17 which modulates and otherwise processes the output speech codes for transmission using techniques that are well known in the art, when switch 18 is positioned as shown by the solid line in FIG. 1.

The voice activity detector 16 monitors the level of the digitized signals received from A/D converter 12. If the level falls below some predetermined threshold, for example during pauses between words or sentences in a conversation, the voice activity detector 16 outputs a signal indicating that a period of silence has begun. This signal is used to move the switch 18 into the position illustrated by the dotted lines such that the comfort noise generator 15 provides data for transmission to transmitter unit 17. The comfort noise generator 15 monitors the background noise received in the digitized signals from A/D converter 12. For example, signals outside of the relatively narrow voice bandwidth can be considered noise and monitored by the comfort noise functions in block 15. Comfort noise information is generated at block 15 which indicates what type of background noise should be generated at the receiver to fill periods of silence. The transmitter unit 17 transmits the comfort noise information and then becomes inoperative until additional comfort noise information is received or until the voice encoder 14 begins to output synthesized speech codes to the transmitter unit 17 when voice activity is again detected.

Figure 2:
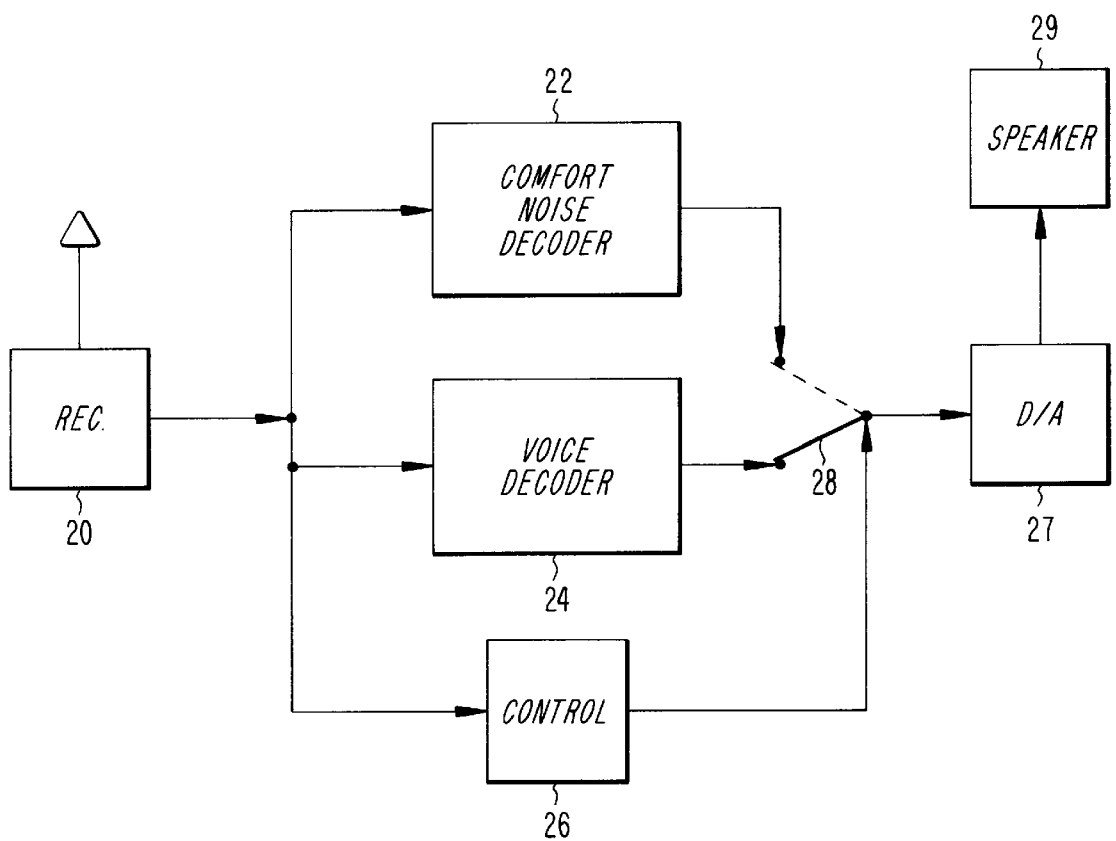
FIG. 2 is a block diagram of a conventional reception system which can be employed in remote units to generate comfort noise during periods of silence.

FIG. 2 illustrates a corresponding block diagram level receive circuit for processing information transmitted by the transmission circuitry of FIG. 1. Although not specifically described herein, those skilled in the art will appreciate that the information transmitted from a remote unit by way of circuitry described in FIG. 1 will typically first be relayed through a radiocommunication system (e.g., a base station associated with the transmitting remote unit, a fixed network for receiving and sending signals to the base station, and another base station associated with a receiver's remote unit). FIG. 2 for purposes of simplicity, however, presumes that the same information transmitted by the circuitry of FIG. 1 is received by a remote unit's receive circuitry. Therein, the receive signals are processed at receiving block 20 using techniques which are well known in the art including, among other things, demodulation. The processed signals are then forwarded to comfort noise decoder 22, voice decoder 24 and control circuitry 26. Comfort noise decoder 22 receives the comfort noise information transmitted by transmitter unit 17 during periods of silence and translates this information into a digital comfort noise signal. Voice decoder 24 receives the synthesized speech codes and translates these speech codes into reproducible digital speech signals. Control block 26 monitors the information received by block 20 and provides a control output signal to switch 28 for determining whether the digital comfort noise signal or the digital speech signal are to be output from the system. For example, during periods of voice activity, the voice decoder 24 will receive the synthesized speech codes and control circuit 26 will position switch 28 as shown by the solid line in FIG. 2 so that the speech signals are output to digital to analog (D/A) converter 27 for reproduction by speaker 29. If, oh the other hand, a period of silence is encountered, then the comfort noise signal generated by comfort noise decoder 22 will be switched to the D/A converter 27 by movement of switch 28 into the position illustrated by the dotted lines in FIG. 2. This will result in the comfort noise signal being transformed into analog signals which are reproduced at speaker 29.

Figure 3:
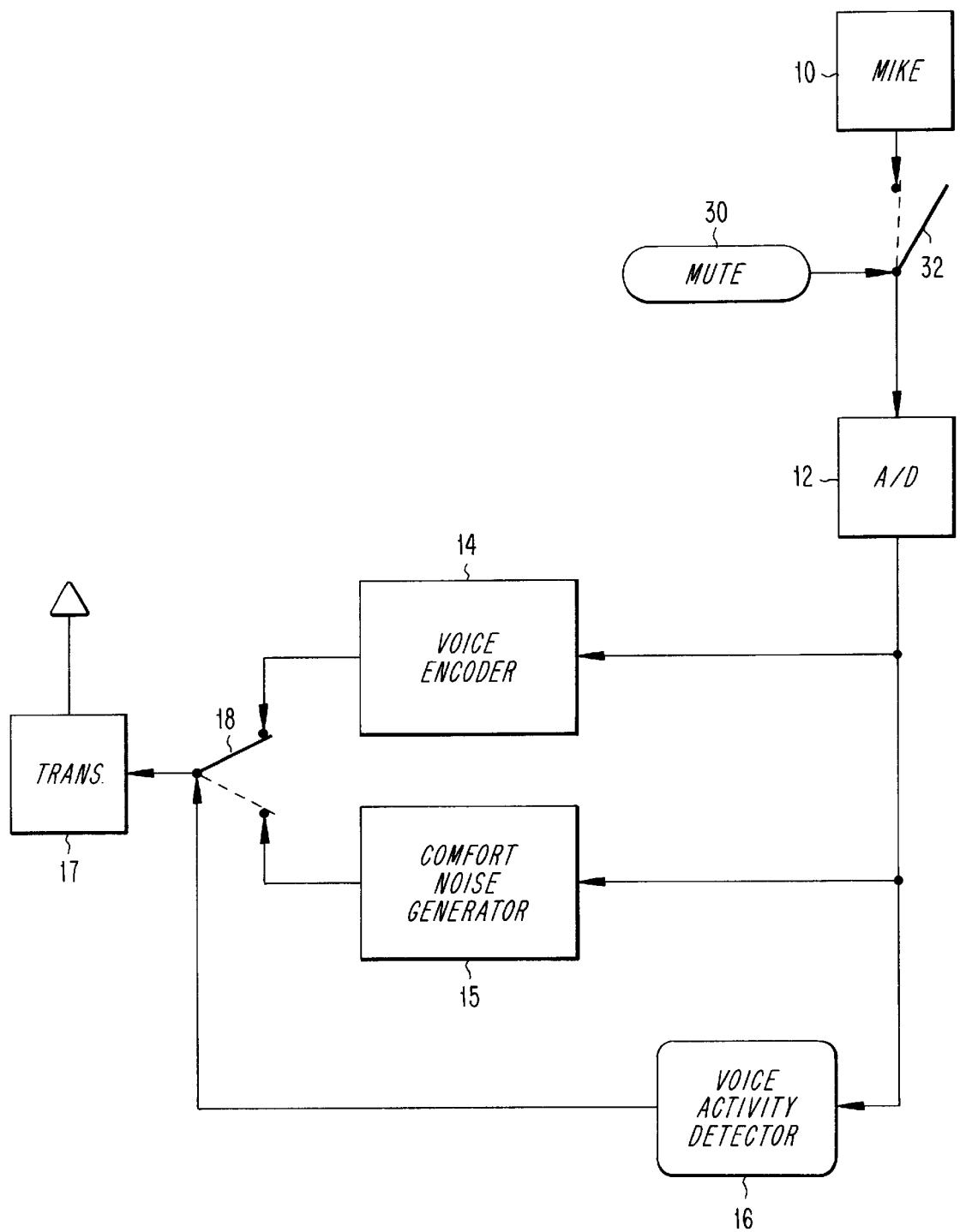
FIG. 3 is a block diagram of the conventional transmission system of FIG. 1 including a muting function.

Applicants, however, have recognized another problem associated With the type of conventional circuitry exemplified by FIGS. 1 and 2. Specifically, it may be desirable to provide a mute function for remote units in order to mute the transmission of voice signals therefrom. For example, it may be desirable to provide a mute button on a mobile phone which allows a subscriber to selectively mute the transmission of voices from that unit Conventionally, this functionality has been provided as illustrated in FIG. 3. Therein, those elements which have been described above with respect to FIG. I have the same reference numeral and are not described again herein. It will be noted, however, that the mute function 30 controls a switch 32 which selectively allows information to be passed from the microphone 10 to the A/D converter 12. For example, when a user depresses a mute button on his or her remote unit, the mute function 30 will actuate the switch 32 into its open position as illustrated by the solid line in FIG. 3. Thus, the A/D converter 12 will receive no information when the phone is operating in its muted mode and he voice activity detector 16 will subsequently indicate that a period of silence is beginning, causing the comfort noise functions in block 15 to be output to transmitter 17.

However, during the period of time when switch 32 is open, the comfort noise functions which otherwise continuously monitor the background noise received from microphone 10, will receive only complete silence because no background noise information is output from A/D converter 12. Since the comfort noise functions are adaptive functions which gradually process received background noise to provide continuity in the transmitted comfort noise information, these functions will gradually adapt to the zero level input received from A/D converter 12 during the time that the remote unit is muted. Thus, in this case, the comfort noise information sent via transmitter 17 will result in comfort noise being generated at the receive side at a lower level than is appropriate for the actual background noise experienced. When the user deactivates the mute function 30 and switch 32 closes again, the adaptive comfort noise functions in block 15 will take some period of time, for example, up to 20 seconds, to accurately determine the actual background noise which is now correctly being supplied to block 15 and to start generating correct comfort noise information again.

Figure 4:
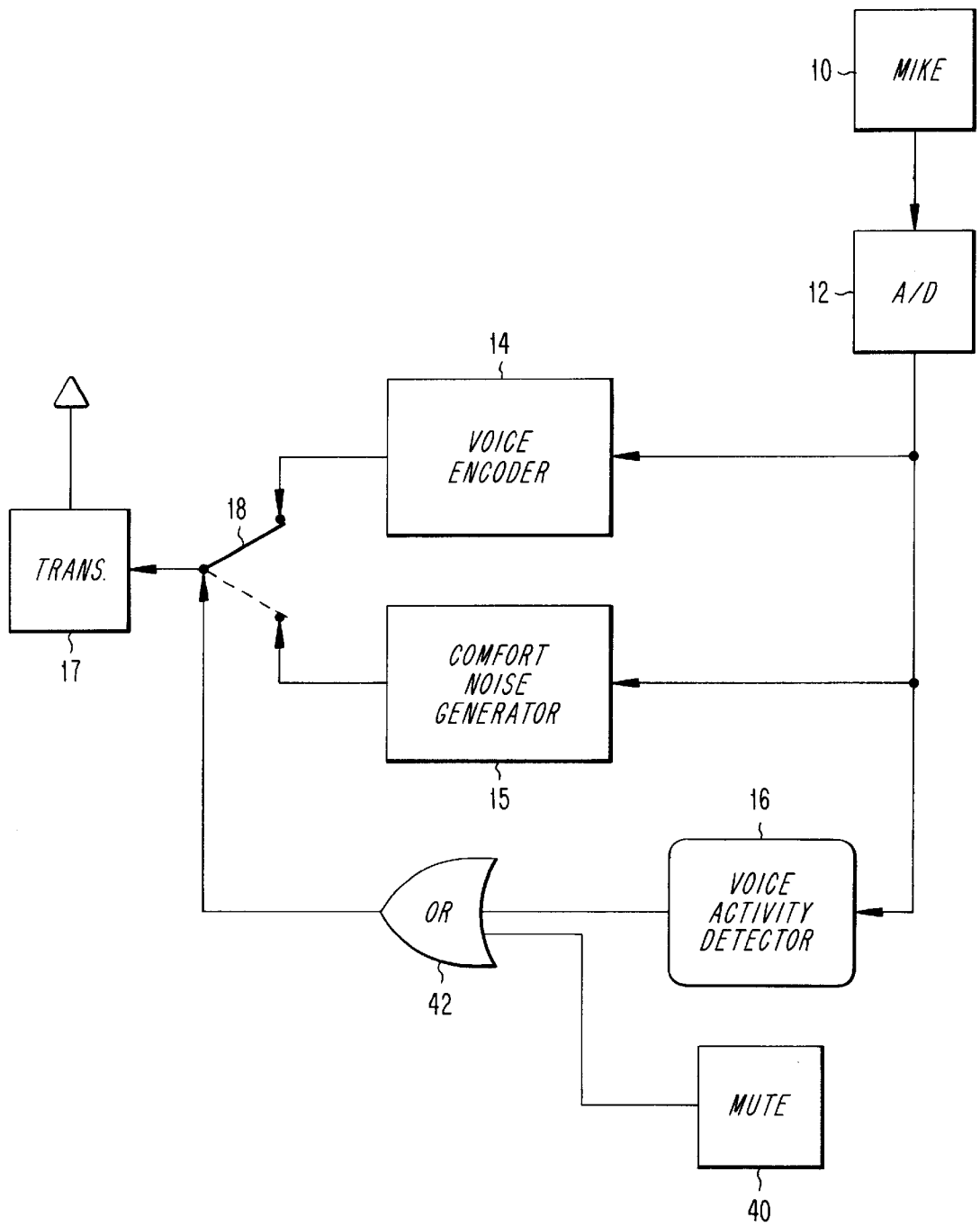
FIG. 4 is a block diagram of a transmission system including a muting function according to an exemplary embodiment of the present invention.

Exemplary embodiments of the present invention avoid the above-described problems by preserving the continuous flow of information to the comfort noise functions even when a muting mode is invoked. FIG. 4 illustrates a first exemplary embodiment of the present invention wherein the comfort noise generator 15 is provided with continuous information regarding the background noise received at microphone 10. Like FIG. 3, FIG. 4 represents an exemplary transmission branch in a remote station or mobile telephone. Unlike FIG. 3, however, activating the mute function does not interrupt the flow of information to the A/D converter 12. Instead, when a user operates the mute function 40 (e.g., by pressing a mute button), switch 18 moves into the position illustrated by the dotted line in FIG. 4. As can be seen in FIG. 4, either a pause in the received speech detected by voice activity detector 16 or selection of the mute function 40 will cause OR gate 42 to generate a signal that moves switch 18 into the dotted line position. Thus, for this exemplary embodiment, a user on the receiving side of transmissions generated by the exemplary embodiment of FIG. 4 will be unable to discern a difference between selected muting of transmissions by a remote station user via mute function 40 and normal pauses in speech. This may be desirable, when, for example, a subscriber does not wish to let the receiving party know that voices are being selectively withheld from transmission.

Figure 5:
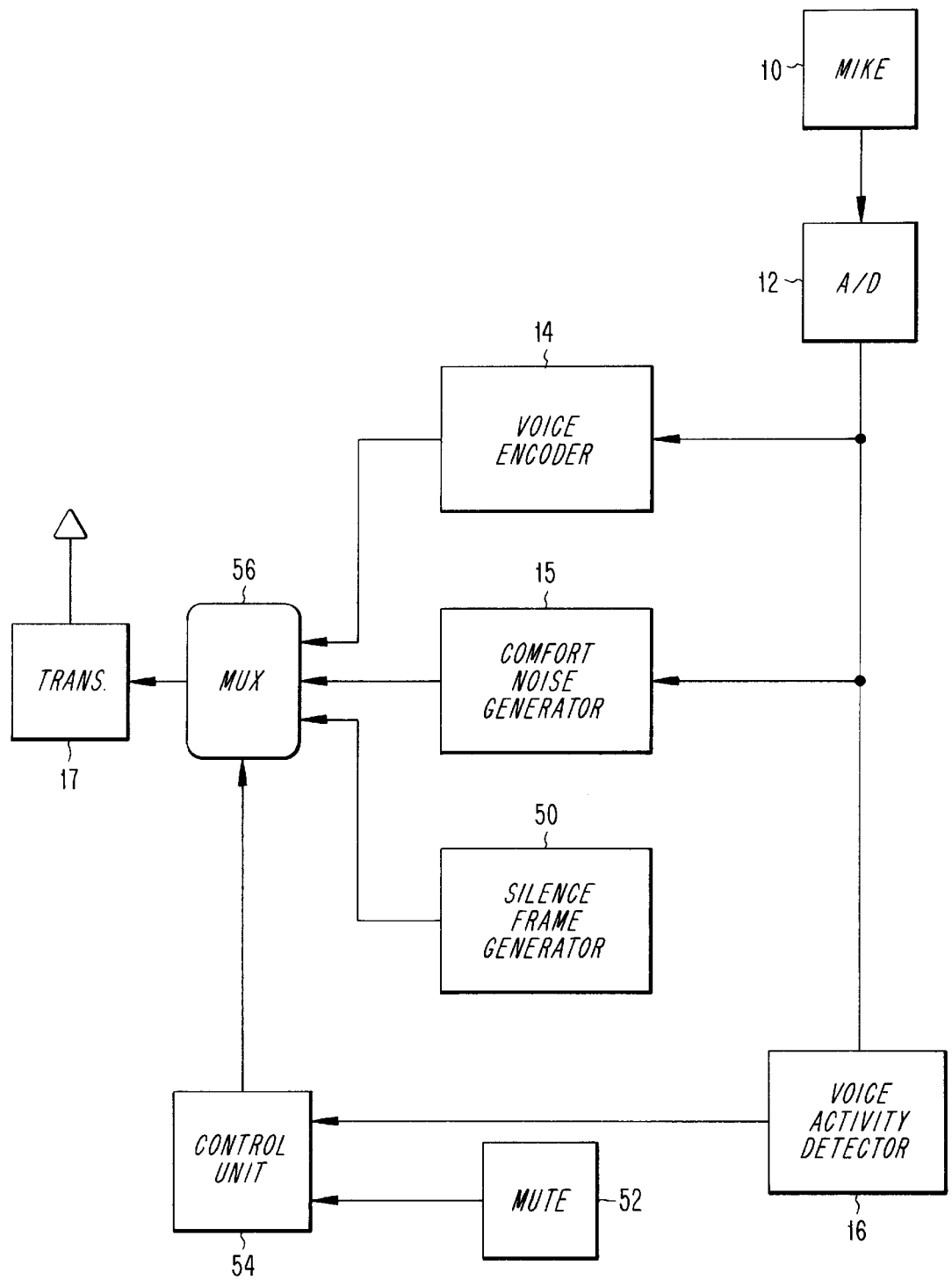
FIG. 5 is a block diagram of a transmission system including a muting function according to a second exemplary embodiment of the present invention.

Another exemplary embodiment of the present invention is illustrated in FIG. 5. Therein, functional blocks described above have been referred to using the same reference numerals and are not described again herein. However, in this exemplary embodiment, a silence frame generator 50 is provided for supplying silence frames to transmitter unit 17 when a user selects a muting mode using mute function 52. Silence frames, for example those defined by the GSM specification 06.11 which disclosure is incorporated here by reference, create information which, when reproduced, results in no sound being generated from speaker 29 of a receiving remote unit. According to the exemplary embodiment of FIG. 5, background noise is continuously supplied to the comfort noise generator 15 so that when periods of silence occur during normal conservation and the route function 52 is not activated, the comfort noise generator will supply accurate background noise information to transmitter 17 as controlled by voice activity detector 16, control unit 54 and multiplexer 56. Thus, a recipient of signals transmitted using the exemplary transmission circuitry of FIG. 5 will be able to distinguish between periods of conversation silence and periods during which a remote station user has opted to mute transmissions, since the former will result in background noise being reproduced at the recipient's speaker while the latter will result in silence being reproduced.

The foregoing exemplary embodiments have been described in the context of remote unit transmission circuitry having discontinuous transmitters which are turned off during periods of silence to conserve energy. Some systems, however, do not turn off the transmitters, but instead continue to transmit. The present invention is equally applicable to those systems, since the same types of comfort noise functions can be present in the transmission circuitry of those systems, with the same need to monitor background noise.

The above-described exemplary embodiments are intended to be illustrative in all respects, rather than restrictive, of the present invention. Thus the present invention is capable of many variations in detailed implementation that can derived from the description contained herein by a person skilled in the art. For example, since the two exemplary embodiments described above result in slightly different muting results, i.e., using comfort noise frames the listener cannot distinguish between muting and silence, whereas using silence frames the listener can distinguish between these two events, it may be desirable to combine these embodiments to provide two different types of muting. AU such variations and modifications are considered to be within the scope and spirit of the present invention as defined by the following claims.

What is claimed is:

1. A remote station comprising:

an audio input device for receiving audio signals;

an encoding circuit for encoding said received audio signals to generate encoded speech signals;

a generator for generating alternative information signals;

a transmitter for selectively transmitting one of said encoded speech signals and said alternative information signals; and a muting input switchable between a muting mode and a non-muting mode, wherein said transmitter selectively transmits said alternative information signals when said muting input is set to said muting mode and transmits said encoded speech signals when said muting input is set to said non-muting mode, and wherein said received audio signals continue to be supplied to said generator when said muting input is set to said muting mode.

2. The remote station of claim 1, wherein said encoding circuit is a code excited linear prediction encoder.

3. The remote station of claim 1, wherein said encoding circuit employs regular pulse excitation long-term prediction to generate said encoded speech signals.

4. The remote station of claim 1, wherein said audio input device is a microphone.

5. The remote station of claim 1, wherein said generator generates comfort noise information as said alternative information signals.

6. The remote station of claim 1, wherein said generator generates silence frames as said alternative information signals.

7. The remote station of claim 1, further comprising a audio activity detector which monitors an activity level of said received audio signals.

8. A mobile station comprising:

means for receiving audio signals;

means for encoding said audio signals into encoded speech frames;

means for generating background frames;

means for selecting a mute mode, wherein said audio signals continue to be supplied to said means for generating background frames when said mute mode is selected; and means for transmitting said background frames when said mute mode is selected and for otherwise transmitting said encoded speech frames.

9. The mobile station of claim 8, wherein said means for receiving audio signals includes a microphone.

10. The mobile station of claim 8, wherein said means for encoding includes a code excited linear prediction encoder.

11. The remote station of claim 8, wherein said encoding circuit employs regular pulse excitation long-term prediction to generate said encoded speech signals.

12. The mobile station of claim 8, wherein said means for generating background frames generates silence frames.

13. The mobile station of claim 8, wherein said means for generating background frames generates comfort noise frames.

14. The mobile station of claim 8, wherein said means for selecting includes a button on said mobile station.

15. The mobile station of claim 8, further comprising means for detecting a voice activity level associated with said received audio signals.

16. A method for transmitting background noise during selective muting of a radiocommunication device comprising the steps of:

receiving input audio signals;

encoding said input audio signals to generate encoded speech frames;

determining whether a muting function is active;

transmitting said encoded speech frames if said muting function is not active; and transmitting frames of information other than said encoded speech frames if said muting function is active, wherein the transmission of information other than said encoded speech frames is based on audio signals received during a time that said muting function is active.

17. The method of claim 16, wherein said radiocommunication device is a mobile station.

18. The method of claim 16, wherein said frames of information other than said encoded speech frames include one of silence frames and comfort noise frames.

* * * * *